(12) United States Patent
Adlerstein et al.

(10) Patent No.: US 6,762,653 B2
(45) Date of Patent: Jul. 13, 2004

(54) MICROWAVE POWER AMPLIFIER

(75) Inventors: Michael Adlerstein, Wellesley, MA (US); James W. McClymonds, Waltham, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 10/228,893

(22) Filed: Aug. 27, 2002

(65) Prior Publication Data

US 2004/0041658 A1 Mar. 4, 2004

(51) Int. Cl.⁷ .............................. H01P 5/12; H03F 3/28
(52) U.S. Cl. ...................................... 333/125; 333/121
(58) Field of Search .............................. 333/125, 121, 333/120, 122, 117, 128; 330/124 R, 286, 287, 126

(56) References Cited

U.S. PATENT DOCUMENTS

| | | | | |
|---|---|---|---|---|
| 3,571,739 A | * | 3/1971 | Seidel | 330/4.5 |
| 3,986,188 A | * | 10/1976 | True | 342/14 |
| 4,477,781 A | * | 10/1984 | Reuss, Jr. | 330/286 |
| 4,902,985 A | * | 2/1990 | Arthur et al. | 330/287 |
| 5,214,394 A | * | 5/1993 | Wong | 330/286 |
| 5,966,048 A | * | 10/1999 | Thompson | 330/124 R |
| 6,304,155 B1 | * | 10/2001 | Fries | 333/117 |

* cited by examiner

*Primary Examiner*—Brian Young
*Assistant Examiner*—John B Nguyen
(74) *Attorney, Agent, or Firm*—Daly, Crowley & Mofford, LLP

(57) ABSTRACT

An amplifier is provided having an electrically conductive structure. The structure has a waveguide network disposed in an inner region thereof. The network has an input section and an output section. The conductive structure has an amplifier input port and amplifier output port formed in outer wall portions of such structure. The network also includes a plurality of amplifier module input ports disposed in an outer surface of the structure. The amplifier input ports are coupled to the amplifier port through the input section of the network. The network further includes a plurality of amplifier module output ports disposed in said outer surface of the structure. The amplifier module output ports are coupled to the amplifier output port through the output section of the network. Each one of the amplifier module output ports is associated with one of the plurality of amplifier module input ports. The amplifier includes a plurality of amplifier modules. Each one of the amplifier modules has an input and an output. The input each amplifier module is coupled to a corresponding one of the amplifier input ports and the output of such module is coupled to the amplifier output port of the one of the amplifier output ports associated with such one of the amplifier input ports.

28 Claims, 10 Drawing Sheets

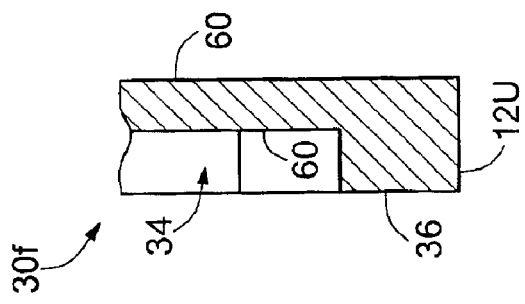
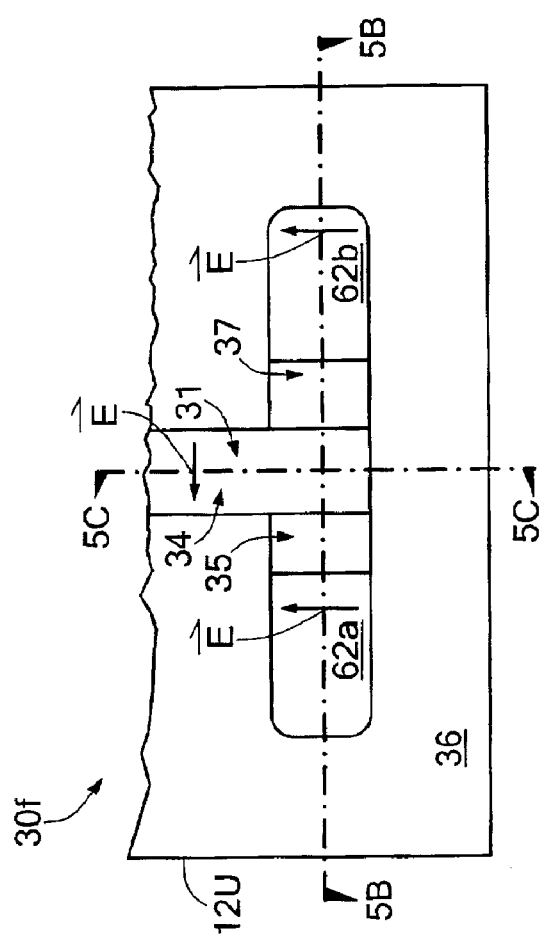
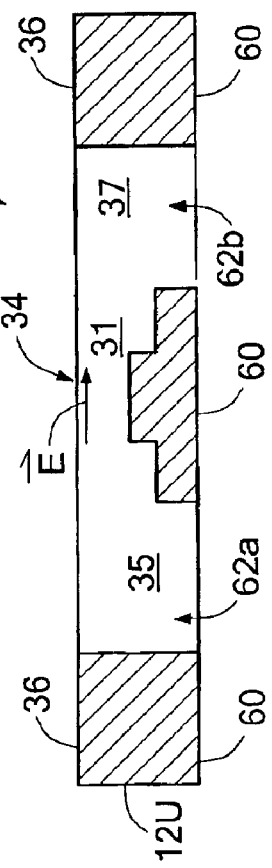

MICROWAVE POWER AMPLIFIER

TECHNICAL FIELD

This invention relates to microwave amplifiers, and more particularly to high power microwave amplifiers.

BACKGROUND

As is known in the art, microwave amplifiers have a wide variety of applications. In some of such applications, microwave signals must be amplified to relatively high power levels. One technique suggested to provide such high power amplification is to divide the signal to be amplified into a plurality of signal channels, each channel having an amplifier module. The outputs of the amplifier modules are then combined into a composite signal. The limit to such an approach however is dictated by power losses in the combining network and the requirement of properly phasing each of the amplifiers (i.e., transistors). In addition, isolation should be provided between modules so the effect of module failure on overall amplifier power will be minimized. In a practical case, such as at Ku-band, the output power of typical Microwave Monolithic Integrated Circuit (MMIC) chips providing the power amplifier modules are in the order of 10 Watts maximum. However, some applications require even higher output power.

SUMMARY

In accordance with the invention, an amplifier is provided having an electrically conductive structure. The structure has a waveguide network disposed in an interior region thereof. The waveguide network has an input section and an output section. The conductive structure has an amplifier input port and amplifier output port formed in outer wall portions of such structure. The waveguide network also includes a plurality of amplifier module input ports disposed on an outer surface of the structure. The input port of the conductive structure is coupled to the amplifier module input ports through the input section of the network. The waveguide network further includes a plurality of amplifier module output ports disposed on said outer surface of the structure. The amplifier module output ports are coupled to the output port of the conductive structure through the output section of the network. Each one of the amplifier module output ports is associated with one of the plurality of amplifier module input ports. The amplifier includes a plurality of amplifier modules. Each one of the amplifier modules has an input and an output. The input and output ports of the conductive structure are coupled to a corresponding one of the amplifier input ports and the one of the amplifier output ports associated therewith, respectively.

In one embodiment, the waveguide network comprises a plurality of coupled magic tees.

With such an arrangement, the conductive structure may be mounted on a heat sink to enable removal of wasted heat.

In accordance with the invention, a microwave power amplifier is provided having a waveguide structure. The waveguide structure has formed therein a plurality of coupled waveguide magic tees. A first one of such magic tees has a port providing an input port for the amplifier. A second one of such magic tees has a port providing an output port for the power amplifier. A first portion of the magic tees includes the first one of the magic tees and provides a power divider. The power divider has a plurality of amplifier module input ports. The first portion of the magic tees divides power fed to the input port of the power amplifier to the plurality of amplifier module input ports. A second portion of the magic tees includes the second one of the magic tees and provides a power combiner. The power combiner has a plurality of amplifier module output ports. The second portion of the magic tees combines power at the plurality of amplifier module output ports at the output port of the power amplifier. The amplifier includes a plurality of amplifier modules each one having an input port coupled to a corresponding one of the plurality of amplifier module input ports and each one having an output port coupled to the plurality of amplifier module output ports.

In accordance with another feature of the invention, a microwave power amplifier is provided having a waveguide structure. The waveguide structure has formed therein a plurality of coupled waveguide magic tees. A magic tee has one input port and two output ports so that a signal to the input port is split evenly between the two output ports. A single magic tee can be used to feed an input signal to two amplifier module inputs, or a cascaded network of magic tees can be used to split an input signal "N" ways, where "N" is an integral power of 2, and feed "N" amplifier module inputs. Conversely, a magic tee can be used to combine the outputs of two amplifier modules into a common output port, and a network of magic tees can combine "N" modules.

In one embodiment, the waveguide structure has a pair of conductive blocks. Each one of the blocks has channels formed in a surface thereof. The channels in the pair of conductive blocks provide the plurality of coupled magic tees when the pair of blocks are connected together with the surface of one of the blocks facing the surface of the other one of the blocks.

In one embodiment, one of the pair of blocks has a pair of passages formed therein, such one of the passages extending from a pair of sidearms of one of the magic tees in the first portion thereof and terminating at a pair of apertures in an outer surface of one of the pair of blocks. The amplifier module input port of a corresponding one of the pair of the amplifier modules is disposed over, and coupled to, one of the pair of sidearms of a corresponding one of the magic tees in the first portion thereof through one of the pair of passages.

In one embodiment, the above-mentioned one of the pair of blocks has a second pair of passages formed therein. The second pair of passages extends from a pair of sidearms of one of the magic tees in the second portion thereof and terminates at a pair of second apertures in the outer surface of said one of the pair of blocks. The amplifier module output port of a corresponding one of the pair of the amplifier modules is disposed over, and coupled to, one of the pair of sidearms of a corresponding one of the magic tees in the second portion thereof through one of the second pair of passages.

In one embodiment, H-arms of the first and second portions of the magic tees are formed in a wall of the other one of the pair of blocks. A load is disposed in such one of the blocks at a terminating end of the H-arm.

In one embodiment, each one of the amplifier modules includes one, or more, MMIC chips. The module operates with microstrip transmission line mode energy. A waveguide-to-microstrip transition is provided for transitioning waveguide mode energy passing from the passage for the input port of such amplifier module into microstrip mode energy for the amplifier module.

In one embodiment, a microstrip-to-waveguide transition is provided for transitioning microstrip mode energy passing from the output of the amplifier module into waveguide mode energy to the passage fed by the amplifier module output.

The details of one or more embodiments of the invention are set forth in the accompanying drawings and the description below. Other features, objects, and advantages of the invention will be apparent from the description and drawings, and from the claims.

DESCRIPTION OF DRAWINGS

FIG. 5A is a view of a portion of the bottom surface the upper one of the pair of blocks shown in FIG. 4B, such portion having an exemplary of one of a plurality of magic tees included in the network of FIG. 1;

FIG. 5B is a cross-sectional view of the portion of the bottom surface the upper one of the pair of blocks shown in FIG. 5A, such cross section being taken along line 5B—5B of FIG. 5A;

FIG. 5C is a cross-sectional view of the portion of the bottom surface the upper one of the pair of blocks shown in FIG. 5A, such cross section being taken along line 5C—5C of FIG. 5A;

Like reference symbols in the various drawings indicate like elements.

DETAILED DESCRIPTION

Figure 1:
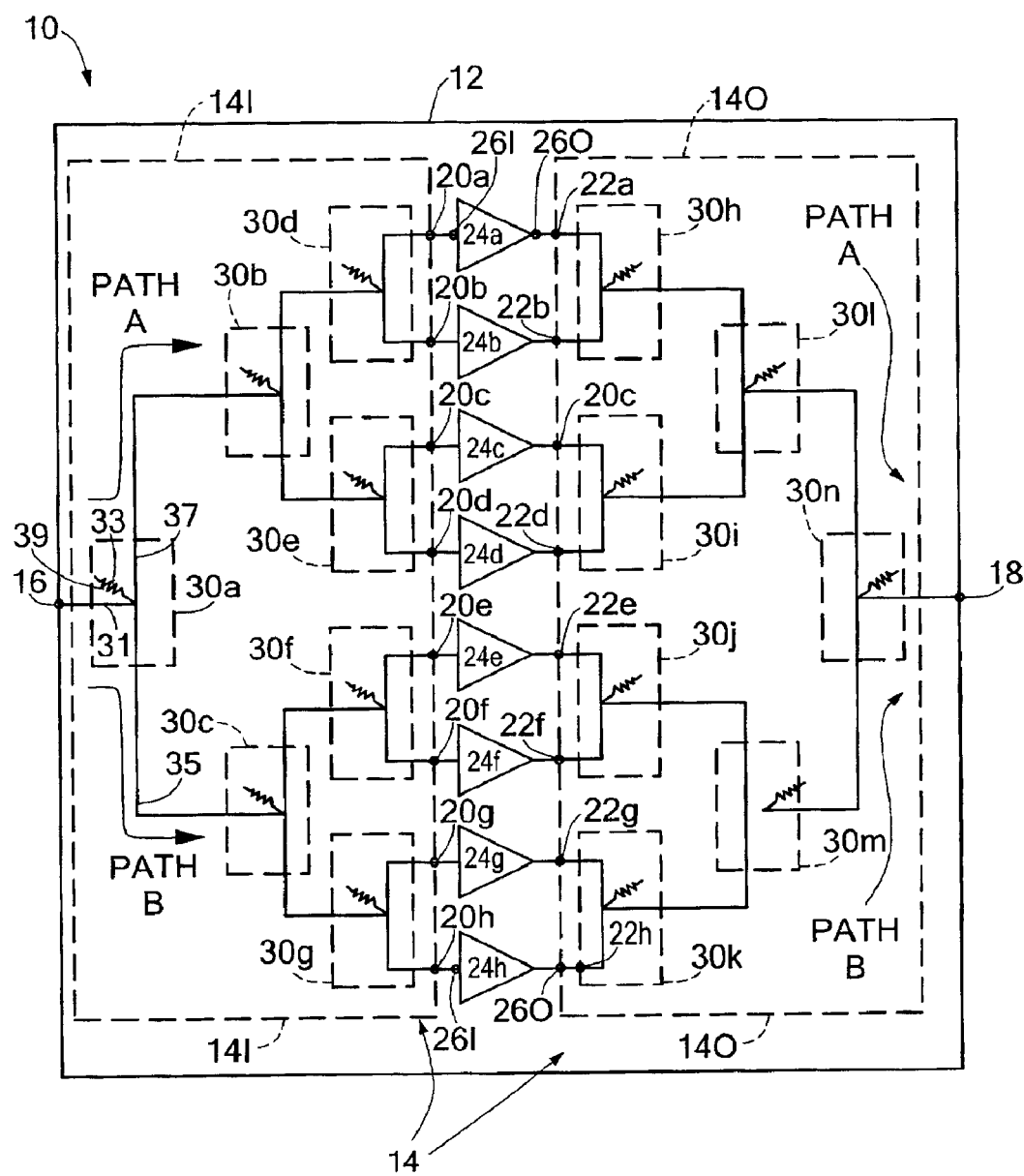
FIG. 1 is a schematic diagram of a microwave power amplifier according to the invention.

Referring now to FIG. 1, a microwave power amplifier 10 is shown having an electrically and thermally conductive structure 12, to be described in more detail in connection with FIGS. 3, 3A, 3B, 4A, 4B, 5A–5D, 6A–6D, 7A–7C. Suffice it to say here the electrically and thermally conductive structure 12 (FIG. 2) is here a pair of upper and lower metallic blocks 12U, 12L, respectively. The structure 12 has a waveguide network 14 (FIG. 1) disposed in an interior region of the block 12 in a manner to be described in connection with FIGS. 3, 3A, 3B, 4A, 4B, 5A–5D, 6A–6D, 7A–7C. The network 14 (FIG. 1) has an input section 14I and an output section 14O. The conductive structure 12 has an amplifier input port 16 and amplifier output port 18 formed in outer wall portions of such structure 12 as shown for output port 18 in FIG. 2. The network 14 (FIG. 1) also includes a plurality of, here eight, amplifier module input ports 20a–20h, as shown disposed in an outer surface of the structure 12 as will be described in connection with FIGS. 2, 8 and 10. The amplifier input ports 20a–20h are coupled to the amplifier port 16 through the input section 14I of the network 14.

The network 14 further includes a plurality of RF amplifier module output ports 22a–22h disposed in said outer surface of the structure 12, in a manner to be described in connection with FIGS. 2, 8 and 10. The amplifier module output ports 22a–22h are coupled to the amplifier output port 18 through the output section 14O of the network 14. Each one of the amplifier module output ports 22a–22h is associated with one of the plurality of amplifier module input ports 20a–20h, respectively. Ports 20a–20h are coupled to input port 16 through the input waveguide network section 14I. The amplifier 10 includes a plurality of amplifier modules 24a–24h, here MMIC amplifiers. Each one of the amplifier modules 24a–24h has an input 26I and an output 26O. The input 26I of each amplifier module 24a–24h is coupled to a corresponding one of the amplifier input ports 20a–20h, respectively. The output 26O of each one of the modules 24a–24h is coupled the one of the amplifier output ports 22a–22h associated with such one of the amplifier input ports 26O. The waveguide network 14 comprises a plurality of coupled magic tees 30a–30n.

More particularly, the magic tees 30a–30g in the input section 14I of network 14 is an arrangement of magic tees provide a power divider for dividing power fed to the input port 16 of the power amplifier 10 equally, to the plurality of amplifier module input ports 20a–20h. The phase of the signals arriving at ports 20a–20h will alternate between in-phase and 180 degrees out of phase. The magic tees 30h–30n in the output section 14O of network 14 is an arrangement of magic tee to provide a power combiner for combing power at the plurality of amplifier module output ports 22a–22h at the output port 18 of the power amplifier 10. The phase of the outputs of the amplifier modules 22a–22h will alternate between in-phase and out-of-phase according to the phases of the input signals to the modules. The combiner network 14O will introduce alternating phase shifts to the signals that enter ports 22a–22h so that the output powers of the amplifier modules will add coherently.

As is known, each magic tee 30a–30n has an E-arm 31, an H-arm 33, and a pair of collinear sidearms 35, 37. The H-arm 33 is terminated in a load 39. Power fed to the E-arm 31 is divided substantially equally between the pair of collinear sidearms 35 and 37. There is a very high degree of isolation between the sidearms 35, 37. Any power difference is absorbed by the load 39.

Thus, microwave power fed to input port 16 is passed to the E-arm 31 of magic tee 30a and such power is divided equally between the sidearms 35, 37 of such magic tee 30a where it is then coupled to the E-arms of magic tees 30b, 30c, respectively. Magic tees 30d–30g operate in like manner so that the power fed to input port 16 is divided equally at the inputs 26I of the amplifier modules 24a–24h.

In a reciprocal manner, power fed to the pair of sidearms 35, 37 of a magic tee is combined in phase at the E-arm thereof and any unbalanced power is absorbed by the load 39 via the H-arm 33. Thus, the power at the outputs 26O of the amplifier modules 24a–24h combine at port 18, it being noted that the electrical length from port 16 to port 18 through amplifiers 24a–24h is equal for all paths. Thus, the signals through all amplifier modules will arrive in phase at output port 18.

Figure 2:
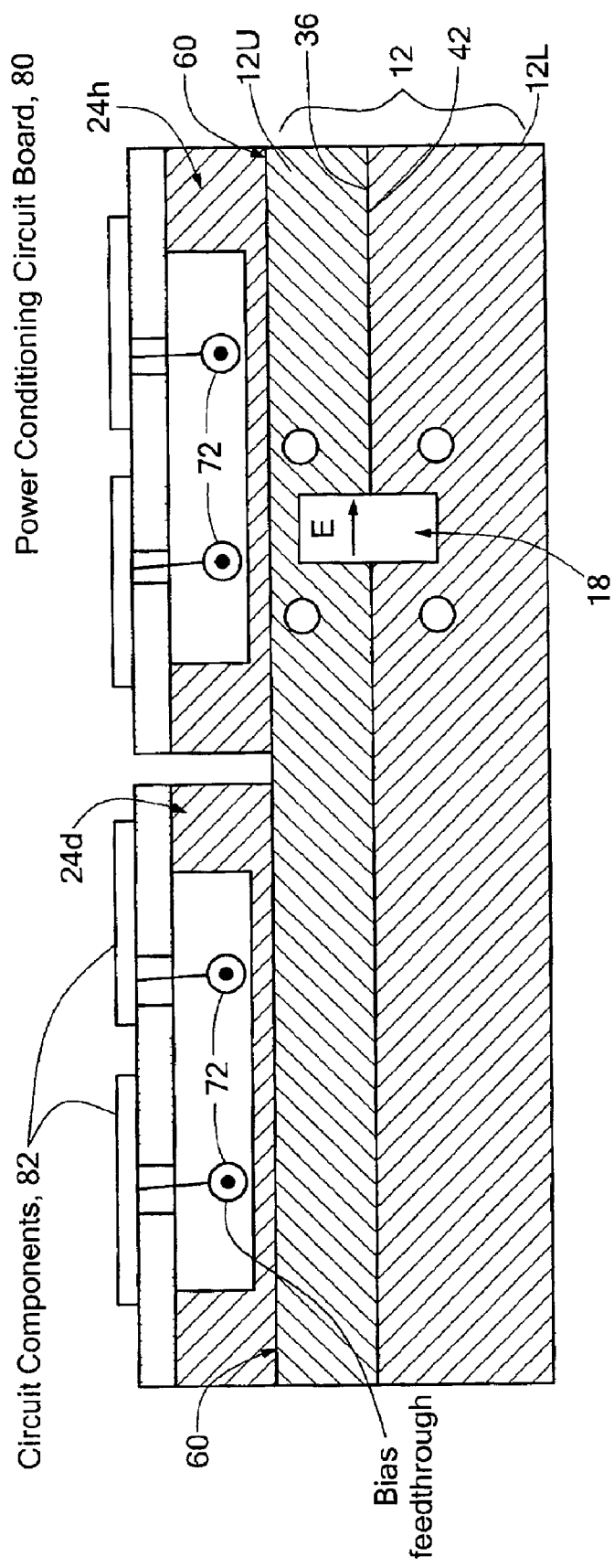
FIG. 2 is a diagrammatical sketch of the microwave amplifier of FIG. 1.

As noted above, the waveguide structure 12 is made from a pair of conductive blocks 12U, 12L (FIG. 2). Each one of the blocks 12U, 12L (FIG. 2) has channels, to be described, formed in a surface thereof. The channels in the pair of conductive blocks 12U, 12L provide network 14 (FIG. 1) including the plurality of coupled magic tees 30a–30n therein when the pair of blocks 12U and 12L are connected together with the surface of one of the blocks facing the surface of the other one of the blocks, such surfaces being disposed within the connected blocks.

Figure 3B:
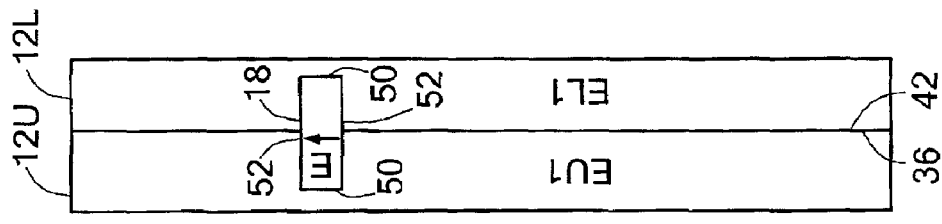
FIG. 3B is a side elevation view of an opposite side of the structure of FIG. 3.
Figure 3:
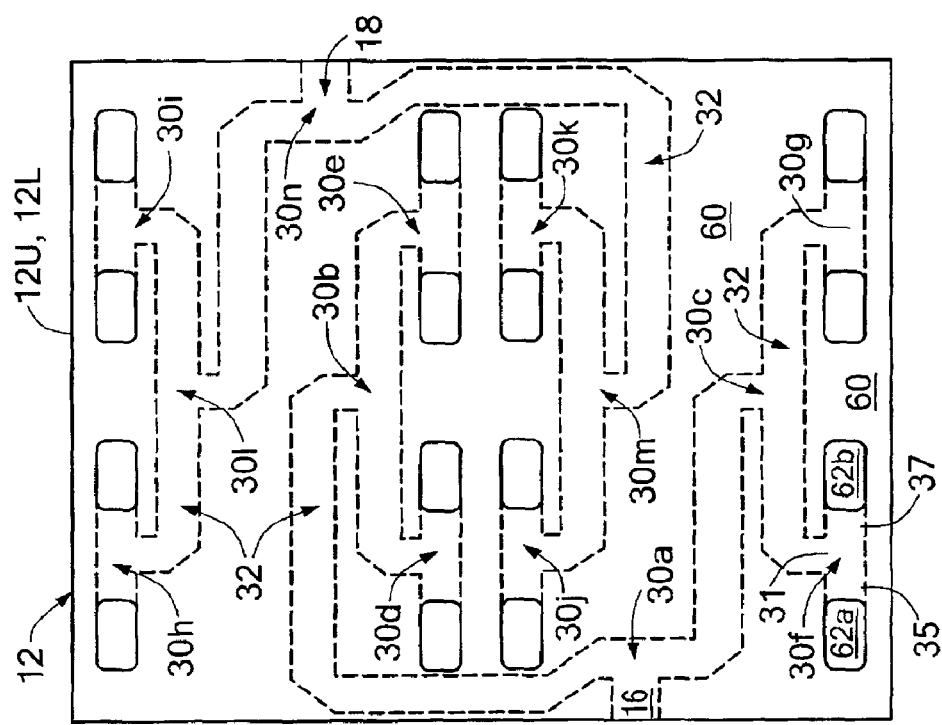
FIG. 3 is a top plan view of a structure having formed in an interior region thereof a waveguide network used in the amplifier of FIG. 1, one portion of such network being a power divider network and another portion of such network being a power combined network.
Figure 3A:
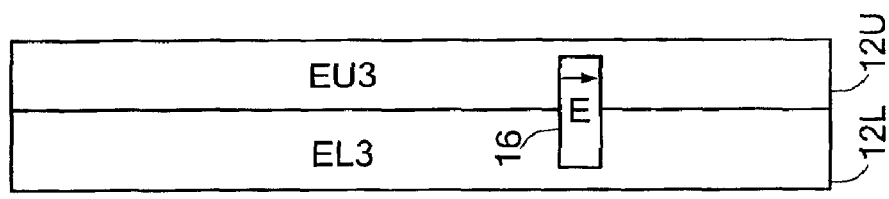
FIG. 3A is a side elevation view of one side of the structure of FIG. 3.
Figure 4A:
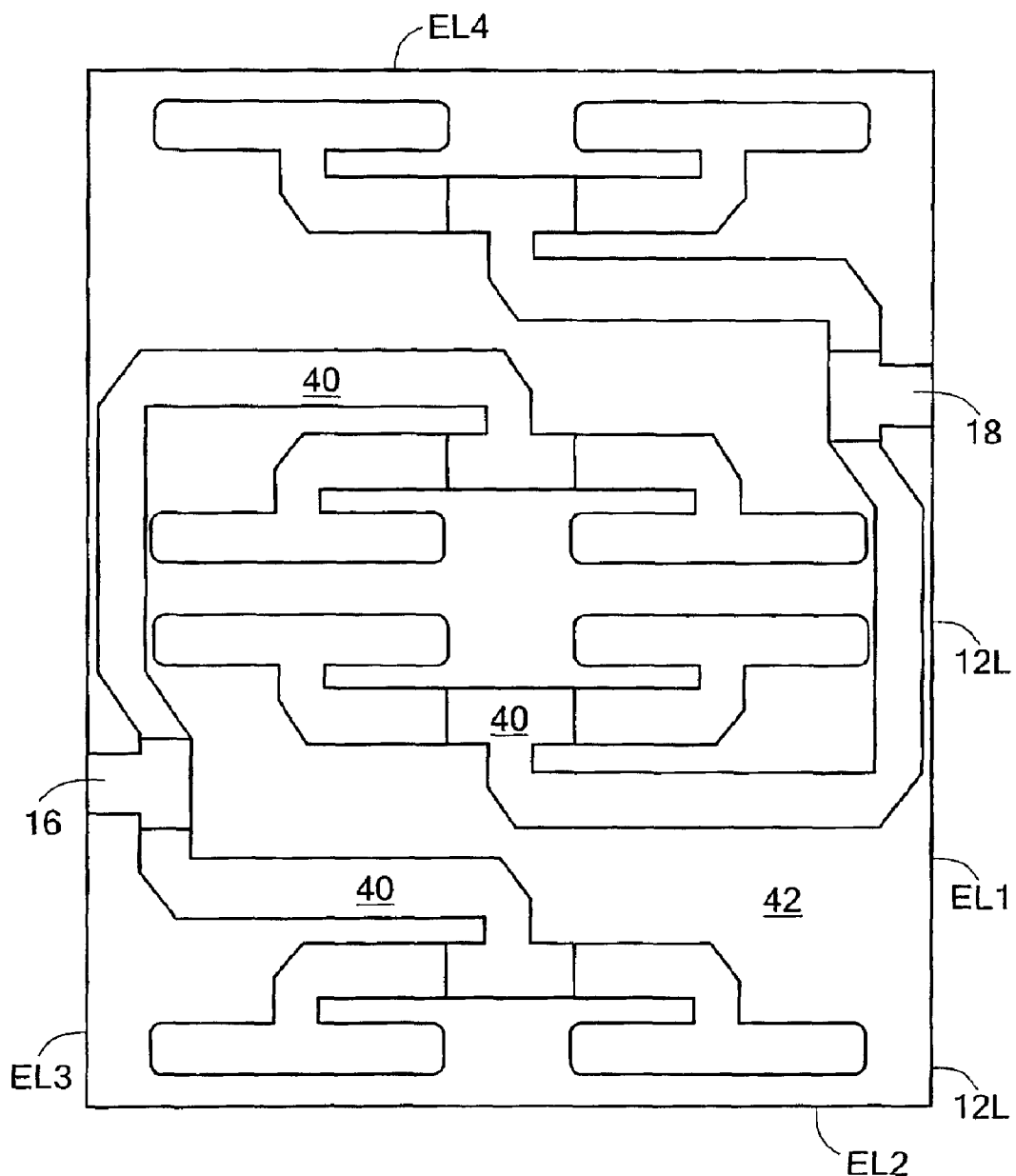
FIG. 4A is a view of the top surface of a lower one of a pair of blocks used to provide the structure of FIGS. 3, 3A and 3B.
Figure 4B:
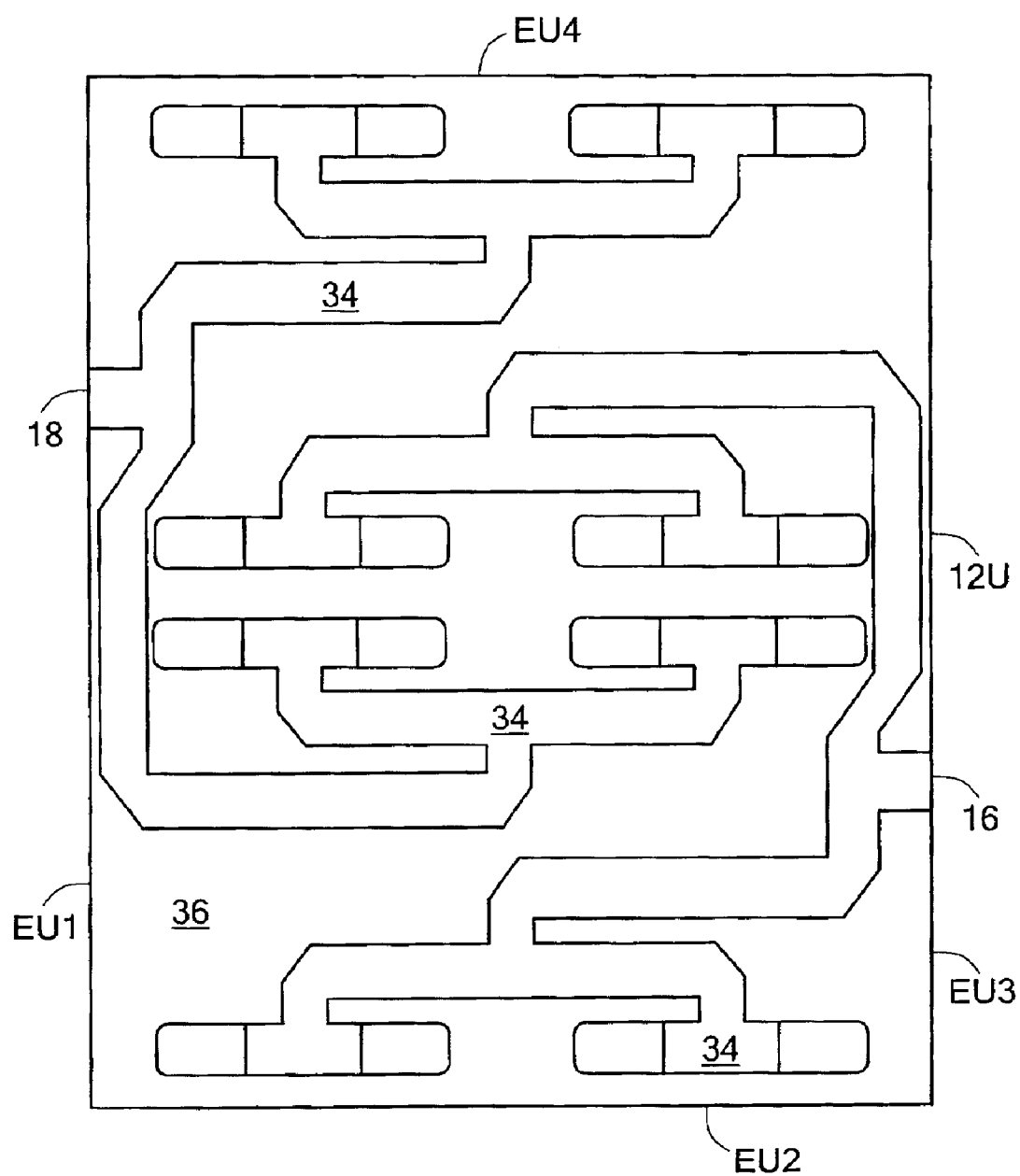
FIG. 4B is a view of the bottom surface an upper one of a pair of blocks used to provide the structure of FIGS. 3, 3A and 3B.

The waveguide transmission lines 32 forming network 14 in structure 12 are shown in FIGS. 3, 3A and 3B. More particularly, the blocks 12U, 12L are shown in FIGS. 4B, 5A–5D and 4A, 6A–6D, respectively. Considering block 12U, such block 12U has grooves 34 milled in a surface 36 thereof (FIG. 4B). It is noted that one set of interconnected groves 34 terminates at input port 16 (i.e., the grooves 34 used to form the input portion 14I of network 14 (FIG. 1)) and another set of such grooves terminates at output port 18 (i.e., the grooves 34 used to form the output portion 14O of network 14). In like manner, considering block 12L (FIG. 4A), such block 12L grooves 40 milled in a surface 42 thereof. It is noted that one set of interconnected grooves 40 terminates at input port 16 (i.e., the grooves 40 used to form the input portion 14I of network 14 (FIG. 1)) and another set of such grooves terminates at output port 18 (i.e., the grooves 40 used to form the output portion 14O of network 14).

It is noted that when the blocks 12U and 12L are fastened together as shown in FIG. 3, edges EU1, EU3 and of block 12U are in registration (i.e., alignment) with edges EL1, EL3 and of block 12L. Further, it is noted from the input port 16 and output port 18 that a rectangular waveguide is formed by the mating grooves 40, 42 within the interior region of the structure 12. Further, the rectangular waveguide has narrow sidewalls 50 thereof parallel to the surfaces 36, 42 and wide sidewalls 52 perpendicular to such surfaces 36, 42. Thus, the electric field vector E is parallel to the surfaces 36, 42 as shown in FIG. 3.

This rectangular waveguide provides the network 14. Arrows indicate the regions where the magic tees 30a–30n are formed in the structure 12 (FIG. 3). A more detailed view of an exemplary one of the magic tees 30a–30n, here magic tee 30n are shown in FIGS. 5A–5C for block 12U, FIGS. 6A–6C for block 12L and FIGS. 7A–7B for the blocks 12U, 12L when such blocks are fastened together to provide the structure 12.

Referring to FIGS. 5A–5C, it is noted in FIGS. 5A and 5B that the groove 34 forms the lower portion of the E-arm 31 (FIG. 1) of magic tee 30a. The E-arm 31 terminates in the pair of collinear sidearms 35, 37. It is also noted that block 12U has a pair of passages 60a, 60b formed therein. The passages 60a, 60b extend from the pair of sidearms 35, 37, respectively, and terminate at a pair of apertures in the outer, upper surface 60 of block 12U (FIGS. 2 and 3).

Figure 6B:
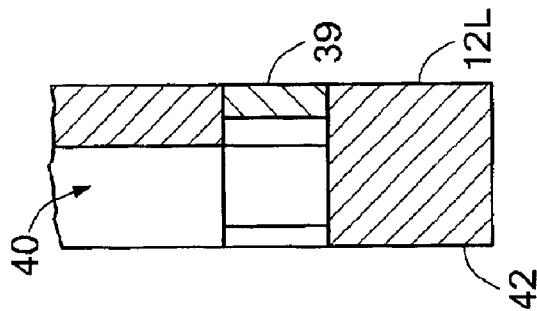
FIG. 6B is a cross-sectional view of the portion of the upper surface the lower one of the pair of blocks shown in FIG. 6A, such cross section being taken along line 6B—6B of FIG. 6A.
Figure 6A:
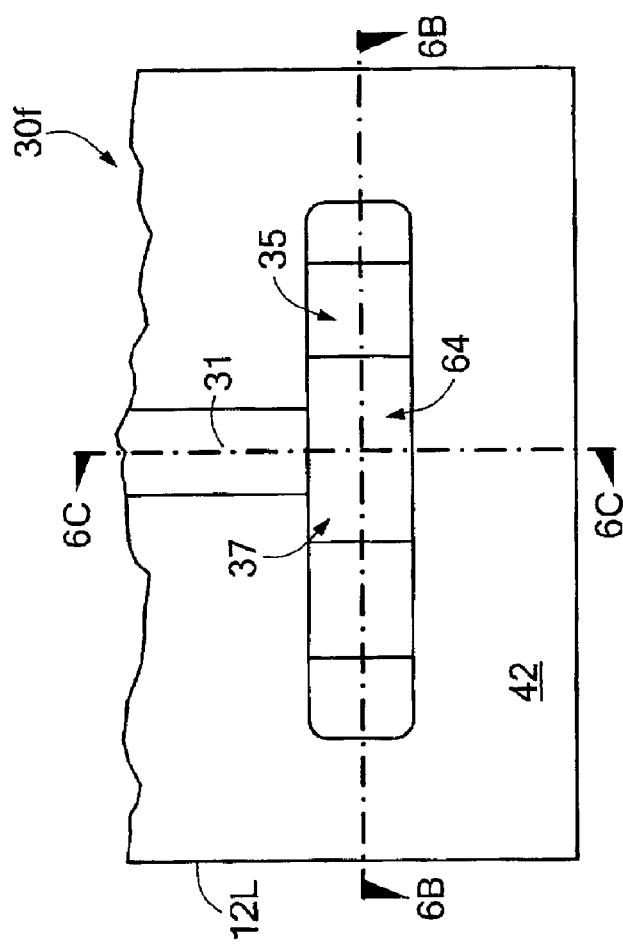
FIG. 6A is a view of a portion of the upper surface of the lower one of the pair of blocks shown in FIG. 4A, such portion shown in FIG. 5A having an exemplary of one of a plurality of magic tees included in the network of FIG. 1.
Figure 6C:
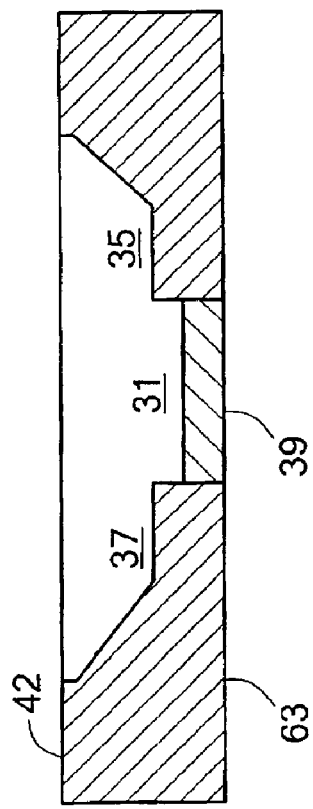
FIG. 6C is a cross-sectional view of the portion of the upper surface the lower one of the pair of blocks shown in FIG. 6A, such cross section being taken along line 6C—6C of FIG. 6A.

Referring to FIGS. 6A–6C, the magic tee 30a is shown to have E-arm 31 terminating the pair of collinear sidearms 35, 37. It is noted that the positions of the sidearms is reversed from FIG. 5A because FIG. 5A is a view of the bottom of the upper block 12U and FIG. 6A is a view of the top of the lower block 12L. The H-arm 33 is formed in the bottom surface 63 of the lower block 12L. More particularly, a hole 64 is formed through the surface 63, as shown in FIG. 6B. A load 39 (FIG. 1) is inserted into the H-arm (i.e., into the void formed by hole 64).

Figure 7A:
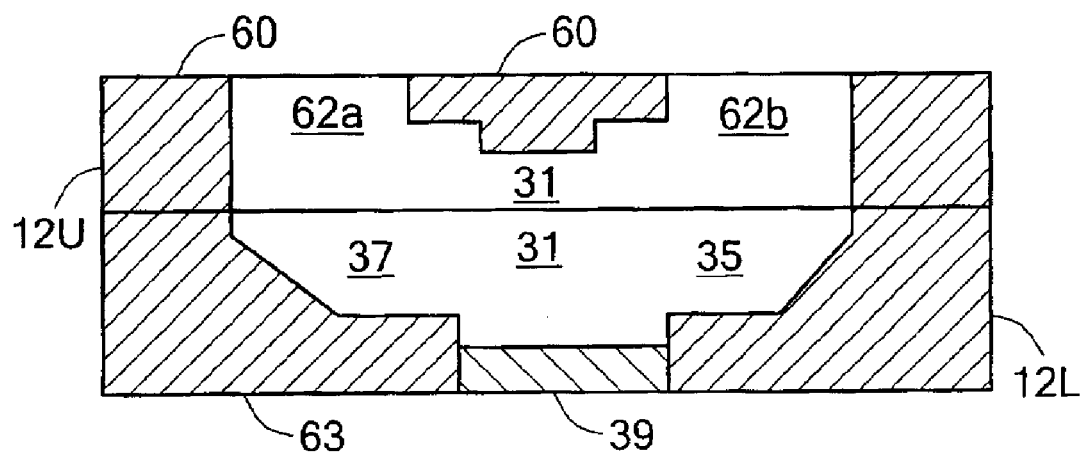
FIG. 7A is a cross-sectional view of the portion of the upper and lower blocks of FIGS. 5B and 6B fastened together to provide the structure of FIG. 3.
Figure 7B:
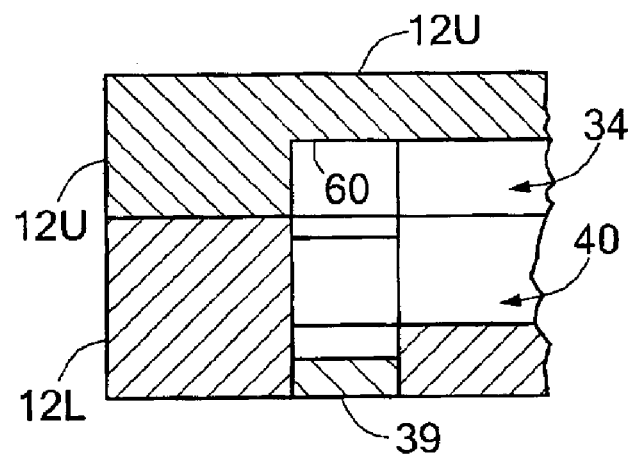
FIG. 7B is a cross-sectional view of the portion of the upper and lower blocks of FIGS. 5C and 6C fastened together to provide the structure of FIG. 3.

Referring now to FIGS. 7A–7C, FIG. 7A shows the structure 12 when blocks 12U and 12L are fastened together to show the E-arm 31 terminating in the pair of collinear sidearms 35, 37, and the sidearms 35, 37 terminating in passages 62a, 62b, respectively. The passages 62a, 62b terminate in the upper surface 60 of the upper block 12U, as shown. FIG. 7B shows the structure 12 when blocks 12U and 12L are fastened together to show the E-arm 31 terminating in H-arm 33. The load 39 is shown in H-arm 33. FIG. 7C shows the structure 12 when blocks 12U and 12L are fastened together to sidearm 35 and the passage 62b terminating in the upper surface 60 of the upper block 12U.

Figure 8:
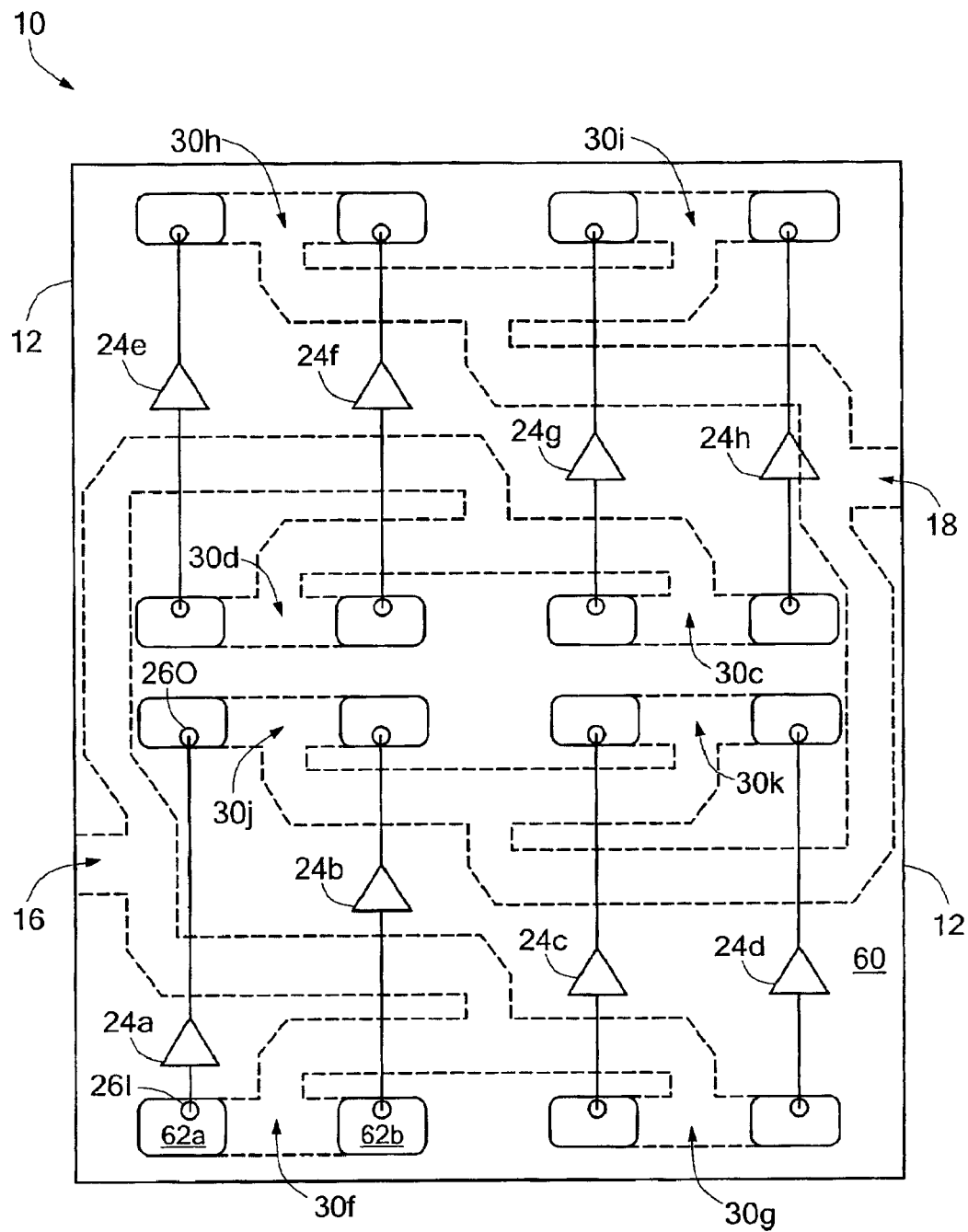
FIG. 8 is a diagrammatical sketch of the microwave power amplifier of FIG. 1.

Referring now to FIG. 8, the upper surface 60 of structure 12 is shown together with a schematic representation of the amplifier modules 24a–24h. It is noted that the input ports 26I and output ports 26O of the amplifier modules 24a–24h are disposed over the passages 62a, 62b. More particularly, the input ports 26I of amplifier modules 24a, 24c, 24e and 24g are disposed over passages 62a of magic tees 30f, 30g, 30d and 30c, respectively. The input ports 26I of amplifier modules 24b, 24d, 24f and 24h are disposed over passages 62b of magic tees 30f, 30g, 30d and 30c, respectively. The output ports 26O of amplifier modules 24a, 24c, 24e and 24g are disposed over passages 62a of magic tees 30j, 30k, 30h and 30i, respectively. The output ports 26O of amplifier modules 24b, 24d, 24f and 24h are disposed over passages 62b of magic tees 30j, 30k, 30h and 30i, respectively.

Figure 10:
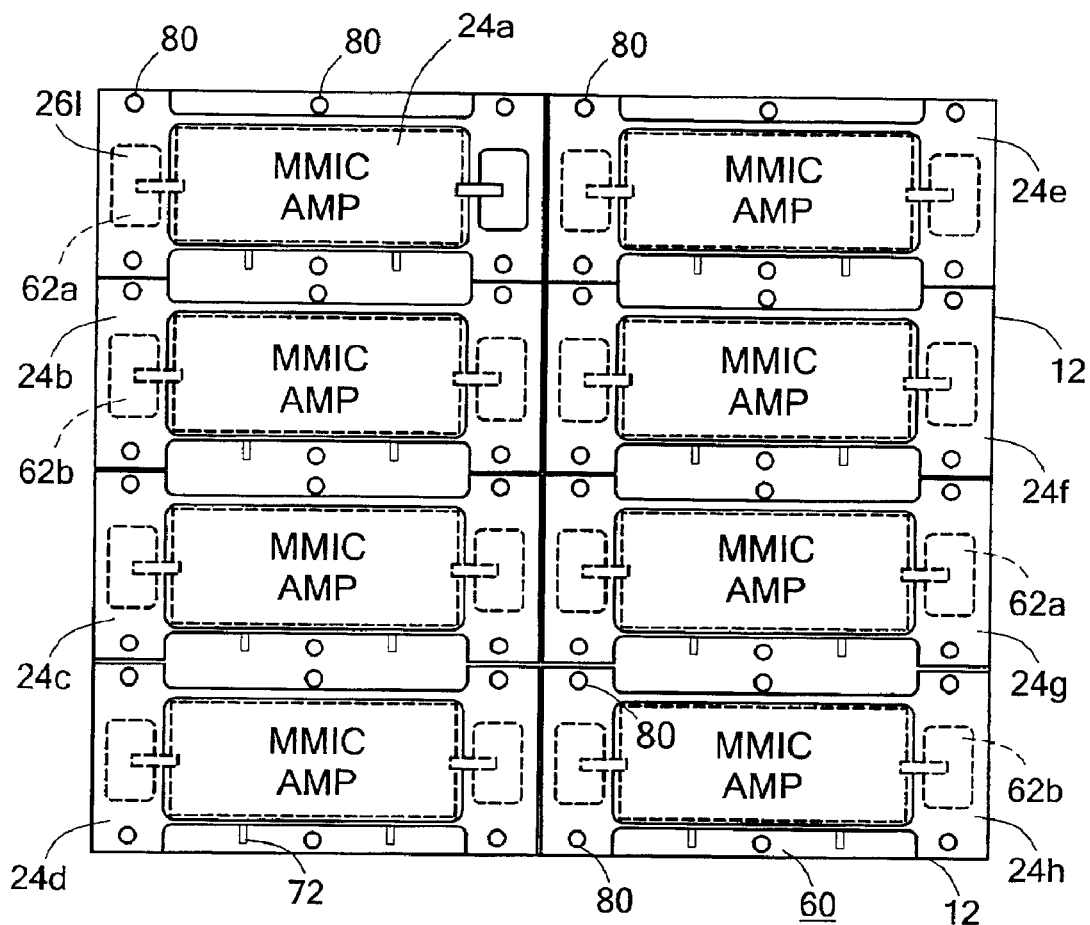
FIG. 10 is a top view of a plurality of amplifier modules of FIG. 9 disposed over the upper surface of the structure of FIG. 3.

Screw holes 80 in FIG. 10 are provided for fastening the amplifier modules to the upper block. The blocks are fastened together with screws not shown.

Figure 9:
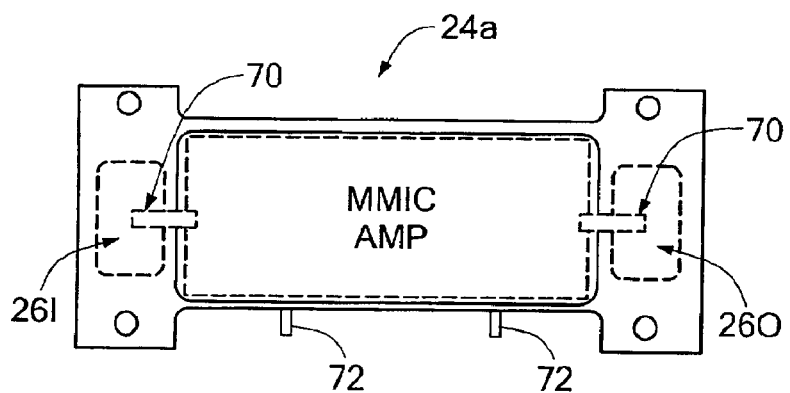
FIG. 9 is a top view of an exemplary one of a plurality of amplifier modules used in the microwave power amplifier of FIG. 1.

Referring now to FIG. 9, an exemplary one of the amplifier modules 24a–24h, here module 24a is shown. It is noted that the module 24a has the input port 26I and the output port 26O. A waveguide-to-microstrip transmission line transition structure 70 is provided at each port 26I and 26O. The transition structure 70 at input port 26I transitions the waveguide mode energy from the passage 26a or 26b feeding energy to such input port 26I to microstrip mode energy. Reciprocally, the transition structure 70 at output port 26O transitions the microstrip mode energy to waveguide mode for the passages 26a, 26b it feeds. Electrical tabs or contacts 72 are provided to supply biasing voltages to the amplifier module 24a.

Referring now to FIG. 10, the amplifier modules 24a–24h are shown disposed over the surface 60 of the structure 12. Thus, reference is made to both FIGS. 8 and 10 which together show the arrangement between the amplifier module input and output ports 26I, 26O and the passages 62a, 62b terminating the sidearms of the magic tees 30f, 30g, 30j, 30k, 30d, 30c, 30h and 30i.

Referring again to FIG. 2, a power conditioning circuit board 80 having circuit components 82 thereon is disposed over the amplifier modules 24a–24h, as shown. The components 82 are electrically connected to the tabs 72 of the modules 24a–24h to provide biasing and power to such modules.

A number of embodiments of the invention have been described. Nevertheless, it will be understood that various modifications may be made without departing from the spirit and scope of the invention. For example, the number of amplifier modules may be more or less than the eight modules shown. Also, the conductive structure may be mounted on a heat sink and enables air to pass through holes in the structure thereby enabling high power handing capability. Accordingly, other embodiments are within the scope of the following claims.

What is claimed is:

1. An amplifier, comprising:
   (A) an electrically conductive structure having a waveguide network disposed in an inner region thereof, such network having:
      an input section;
      an output section; and
      wherein the conductive structure comprises:
         an amplifier input port and amplifier output port formed in outer wall portions of such structure;
         a plurality of amplifier module input ports disposed in an outer surface of the structure, such amplifier input ports being coupled to the amplifier port through the input section of the network;
         a plurality of amplifier module output ports disposed in said outer surface of the structure, such amplifier module output ports being coupled to the amplifier output port through the output section of the network, each one of the amplifier module output ports being associated with one of the plurality of amplifier module input ports; and
   (B) a plurality of amplifier modules, each one having an input and an output, such input and output being coupled to a corresponding one of the amplifier input ports and the one of the amplifier output ports associated therewith, respectively.

2. The amplifier recited in claim 1 wherein the waveguide network comprises a plurality of coupled magic tees.

3. The amplifier recited in claim 2 wherein the structure comprises a pair of conductive blocks.

4. The amplifier recited in claim 3 wherein each one of the blocks has channels formed in a surface thereof, the channels in the pair of conductive blocks providing the plurality of coupled magic tees when the pair of blocks are connected together with the surface of one of the blocks facing the surface of the other one of the blocks.

5. The amplifier recited in claim 4 wherein one of the pair of blocks has a pair of passages formed therein, such passages extending from a pair of sidearms of one of the magic tees in the first portion thereof and terminating at a pair of apertures in an outer surface of one of the pair of blocks.

6. The amplifier recited in claim 5 wherein the amplifier module input port of a corresponding one of the pair of the amplifier modules is disposed over, and coupled to, one of the pair of sidearms of a corresponding one of the magic tees in the first portion thereof through one of the pair of passages.

7. The amplifier recited in claim 6 wherein the above-mentioned one of the pair of blocks has a second pair of passages formed therein, the second pair of passages extends from a pair of sidearms of one of the magic tees in the second portion thereof and terminates at a pair of second apertures in the outer surface of said one of the pair of blocks and wherein the amplifier module output port of a corresponding one of the pair of the amplifier modules is disposed over, and coupled to, one of the pair of sidearms of a corresponding one of the magic tees in the second portion thereof through one of the second pair of passages.

8. The amplifier recited in claim 7 wherein H-arms of the first and second portions of the magic tees are formed in a wall of another one of the pair of blocks.

9. The amplifier recited in claim 8 including a plurality of loads, each one thereof being disposed in such other one of the blocks at a terminating end of the H-arm.

10. The amplifier recited in claim 9 wherein each one of the amplifier modules contains a MMIC chip.

11. The amplifier recited in claim 10 wherein the chip operates with microstrip transmission line mode energy.

12. The amplifier recited in claim 11 including a waveguide-to-microstrip transition for transitioning waveguide mode energy passing from the passage for the input port of such amplifier module into microstrip mode energy for the amplifier.

13. The amplifier recited in claim 12 including a microstrip-to-waveguide transition for transitioning microstrip mode energy passing from the output of the amplifier module into waveguide mode energy to the passage fed by the amplifier module output.

14. A microwave power amplifier, comprising:
   (A) a waveguide structure having formed therein a plurality of coupled waveguide magic tees;
      (i) a first one of such magic tees having a port providing an input port for the amplifier;
      (ii) a second one of such magic tees having a port providing an output port for the power amplifier;
      (iii) a first portion of the magic tees being coupled to the first one of the magic tees to provide a power divider, such power divider having a plurality of amplifier module input ports, such first portion of the magic tees dividing power fed to the input port of the power amplifier to the plurality of amplifier module input ports;
      (iv) a second portion of the magic tees being coupled to the second one of the magic tees to provide a power combiner, such power combiner having a plurality of amplifier module output ports, such second portion of the magic tees combining power at the plurality of amplifier module output ports at the output port of the power amplifier;
   (B) a plurality of amplifier modules each one having an input port coupled to a corresponding one of the plurality of amplifier module input ports and each one having an output port coupled to the plurality of amplifier module output ports; and
   wherein the waveguide structure comprises:
      a pair of conductive blocks, each one having channels formed in a surface thereof, such channels in the pair of conductive blocks providing the plurality of coupled magic tees when the pair of blocks are connected together with the surface of one of the blocks facing the surface of the other one of the blocks.

15. The amplifier recited in claim 14 wherein one of the pair of blocks has a pair of passages formed therein, such passages extending from a pair of sidearms of one of the magic tees in the first portion thereof and terminating at a pair of apertures in an outer surface of said one of the pair of blocks and wherein the amplifier module input ports of a corresponding one of the pair of the amplifier modules is coupled to the pair of sidearms of a corresponding one of the magic tees in the first portion thereof through the pair of passages at the through the apertures.

16. The amplifier recited in claim 15 wherein one of the pair of blocks has a second pair of passages formed therein, such second pair of passages extending from a pair of sidearms of one of the magic tees in the second portion thereof and terminating at a pair of second apertures in an outer surface of said one of the pair of blocks and wherein the amplifier module output ports of a corresponding one of the pair of the amplifier modules is coupled to the pair of sidearms of a corresponding one of the magic tees in the second portion thereof through the second pair of passages the through the second pair of apertures.

17. The amplifier recited in claim 15 wherein H-arms of the first and second portions of the magic tees are terminated in a load.

18. The amplifier recited in claim 15 including:
   (A) a second waveguide structure having formed therein a second plurality of coupled waveguide magic tees;
      (i) a first one of such magic tees in the second plurality thereof having a port providing, with the port of the first one of the magic tees in the first-mentioned plurality of magic tees the input port for the amplifier;
      (ii) a second one of such magic tees in the second plurality thereof having a port providing, with the port of the second one of the magic tees in the first-mentioned plurality of magic tees an output port for the power amplifier;
      (iii) a first portion of the magic tees in the second plurality thereof being coupled to the first one of the magic tees in the second plurality of magic tees for providing a second power divider, such second power divider having a second plurality of amplifier module input ports, such first portion of the magic tees in the second plurality thereof dividing power fed to the input port of the power amplifier to the second plurality of amplifier module input ports;
      (iv) a second portion of the magic tees in the second plurality thereof being coupled to the second one of the magic tees in the second plurality thereof for providing a second power combiner, such second power combiner having a second plurality of amplifier module output ports, such second portion of the magic tees in the second plurality thereof combining power at the second plurality of amplifier module output ports at the output port of the power amplifier;
   (B) a second plurality of amplifier modules each one having an input port coupled to a corresponding one of the second plurality of amplifier module input ports and each one having an output port coupled to a second plurality of amplifier module output ports.

19. The amplifier recited in claim 18 wherein the second waveguide structure comprises:
   said pair of conductive blocks, each one having second channels formed in a surface thereof, such second channels in the pair of conductive blocks providing the second plurality of coupled magic tees when the pair of blocks are connected together with the surface of one of the blocks facing the surface of the other one of the blocks.

20. The amplifier recited in claim 19 wherein pairs of the second amplifier module input ports are coupled to a pair of sidearms of a corresponding one of the first portion of the magic tees of the second plurality of magic tees.

21. The amplifier recited in claim 20 wherein pairs of the second amplifier module output ports are coupled to a pair of sidearms of a corresponding one of the second portion of the magic tees of the second plurality of magic tees.

22. The amplifier recited in claim 21 including a waveguide to microstrip transition and wherein each one of the amplifier modules is a MMIC chip having an input thereof adapted to couple to waveguide mode energy fed to the input port thereof and transform such energy into microstrip mode energy for the amplifier module.

23. The amplifier recited in claim 21 wherein H-arms of the first and second portions of the second plurality of magic tees are terminated in a load.

24. A microwave power amplifier, comprising:
   (A) a waveguide structure having formed therein a pair of waveguide magic tee sections, each one of the sections comprising:
      a plurality of coupled waveguide magic tees,
         (i) a first one of such magic tees having a port providing an input port;
         (ii) a second one of such magic tees having a port providing an output port;
         (iii) a first portion of the magic tees being coupled to the first one of the magic tees for providing a power divider, such power divider having a plurality of amplifier module input ports, such first portion of the magic tees dividing power fed to the input port to the plurality of amplifier module input ports;
         (iv) a second portion of the magic tees being coupled to the second one of the magic tees for providing a power combiner, such power combiner having a plurality of amplifier module output ports, such second portion of the magic tees combining power at the plurality of amplifier module output ports at the output port;
      an input magic tee for coupling an input port of the amplifier to the input ports of the pair of magic tee sections; and
      an output magic tee for coupling an output port of the amplifier to the output ports of the pair of magic tee sections; and
   (B) a pair of amplifier sections, each one of such pair of amplifier module sections being coupled to a corresponding one of the pair of magic tee sections, each one of the amplifier sections, comprising:
      a plurality of amplifier modules each one having an input port coupled to a corresponding one of the plurality of amplifier module input ports of a corresponding one of the magic tee sections and each one having an output port coupled to the plurality of amplifier module output ports of such corresponding one of the magic tee sections,
         wherein the waveguide structure comprises:
            a pair of conductive blocks, each one having a channel formed in a surface thereof, such channels in the pair of conductive blocks providing the pair of magic tee sections when the pair of blocks are connected together with the surface of one of the blocks facing the surface of the other one of the blocks.

25. The amplifier recited in claim 24 wherein pairs of the amplifier module input ports are coupled to a pair of sidearms of a corresponding one of the first portion of the magic tees.

26. The amplifier recited in claim 25 wherein pairs of the amplifier module output ports are coupled to a pair of sidearms of a corresponding one of the second portion of the magic tees.

27. The amplifier recited in claim 26 wherein H-arms of the first and second portions of the magic tees are terminated in a load.

28. The amplifier recited in claim 27 wherein an electrical length from the input port of the amplifier to the output port of the amplifier through one of the pair of magic tee sections and the one of the pair of amplifier sections coupled thereto is equal to the an electrical length from the input port of the amplifier to the output port of the amplifier through the other one of the pair of magic tee sections and the other one of the pair of amplifier sections coupled thereto.

* * * * *

UNITED STATES PATENT AND TRADEMARK OFFICE
CERTIFICATE OF CORRECTION

| | |
|---|---|
| PATENT NO. | : 6,762,653 B2 |
| APPLICATION NO. | : 10/228893 |
| DATED | : July 13, 2004 |
| INVENTOR(S) | : Michael G. Adlerstein et al. |

It is certified that error appears in the above-identified patent and that said Letters Patent is hereby corrected as shown below:

Column 3, line 28 delete "bottom surface an" and replace with --bottom surface of an--.

Column 3, line 31 delete "bottom surface the" and replace with --bottom surface of the--.

Column 3, line 37 delete "bottom surface the" and replace with --bottom surface of the--.

Column 3, line 41 delete "bottom surface the" and replace with --bottom surface of the--.

Column 3, line 49 delete "upper surface the" and replace with --upper surface of the--.

Column 3, line 53 delete "upper surface the" and replace with --upper surface of the--.

Column 4, line 50-51 delete "magic tees provide" and replace with --magic tees to provide--.

Column 4, line 57 delete "magic tee" and replace with --magic tees--.

Column 4, line 58 delete "combing power" and replace with --combining power--.

Column 4, line 41 delete "block 12L grooves 40" and replace with --block 12L has grooves 40--.

Column 4, line 41 delete "input 26I" and replace with --input port 26I--.

Column 4, line 42 delete "The input 26I" and replace with --The input port 26I--.

Column 4, line 44 delete "the output 26O" and replace with --The output port 26O--.

UNITED STATES PATENT AND TRADEMARK OFFICE
CERTIFICATE OF CORRECTION

| | |
|---|---|
| PATENT NO. | : 6,762,653 |
| APPLICATION NO. | : 10/228893 |
| DATED | : July 13, 2004 |
| INVENTOR(S) | : Michael G. Adlerstein et al. |

It is certified that error appears in the above-identified patent and that said Letters Patent is hereby corrected as shown below:

Column 5, line 12 delete "inputs 26I" and replace with --input port 26I--.

On the Title Page;
Abstract, line 18, delete "The input each amplifier" and replace with --The input of each amplifier--.

Signed and Sealed this

Twenty-ninth Day of August, 2006

JON W. DUDAS
*Director of the United States Patent and Trademark Office*